United States Patent [19]

Samarakone et al.

[11] Patent Number: 5,223,377
[45] Date of Patent: Jun. 29, 1993

[54] INTERRUPTED DEVELOPING PROCESS FOR A PHOTORESIST IMAGE

[75] Inventors: Nandasiri Samarakone, Kessello; Patrick Jaenen, Meeuwen; Luc Van den hove, Heverlee, all of Belgium

[73] Assignee: Interuniversitair Micro-Elektronica Centrum VZW, Belgium

[21] Appl. No.: 575,486

[22] Filed: Aug. 29, 1990

[51] Int. Cl.$^5$ .............................................. G03F 7/30
[52] U.S. Cl. .................................... 430/330; 430/322; 430/325; 430/396
[58] Field of Search ............... 430/270, 330, 5, 311, 430/322, 325, 331, 396

[56] References Cited

U.S. PATENT DOCUMENTS

| | | | |
|---|---|---|---|
| 4,423,137 | 12/1983 | Rester | 430/330 |
| 4,573,782 | 3/1986 | Kobayashi et al. | 430/330 |
| 4,610,952 | 9/1986 | Crivello | 430/330 |
| 4,675,273 | 6/1987 | Woods et al. | 430/330 |
| 4,695,527 | 9/1987 | Geissler et al. | 430/330 |

FOREIGN PATENT DOCUMENTS 89375271  11/1989  Japan ..................... 430/330

OTHER PUBLICATIONS

Moreau et al., "Contrast and Sensitivity Enhancement of Resists for High Resolution", *J. Vac. Sci Technol. B*, vol. 6, 2238, Nov./Dec. 1988.

Primary Examiner—Marion E. McCamish
Assistant Examiner—Kathleen Duda
Attorney, Agent, or Firm—Ostrolenk, Faber, Gerb & Soffen

[57] ABSTRACT

A process of developing a photoresist by contacting the photoresist with a developer is improved by subjecting the photoresist to heat prior to completion of the development process.

18 Claims, 4 Drawing Sheets

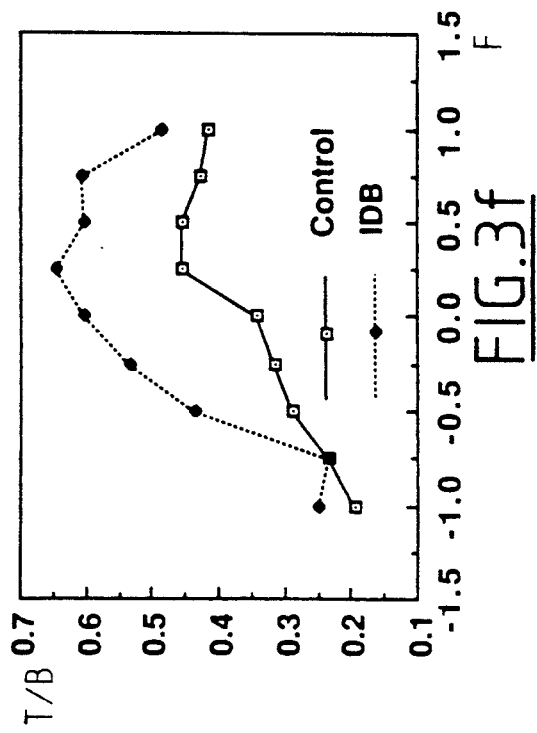
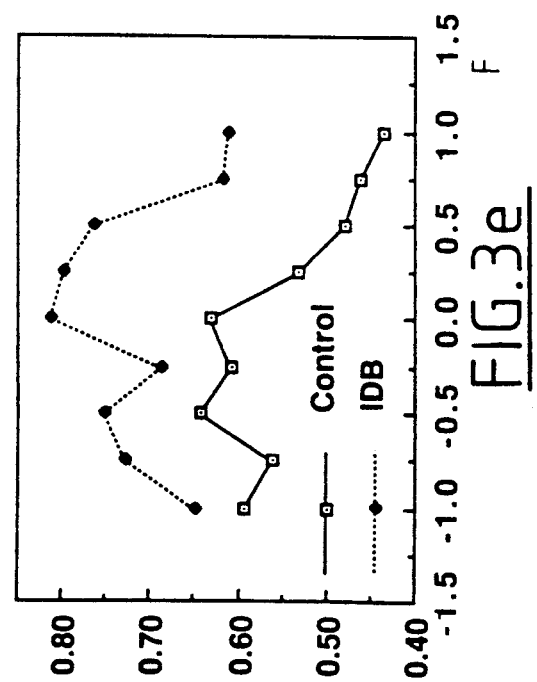
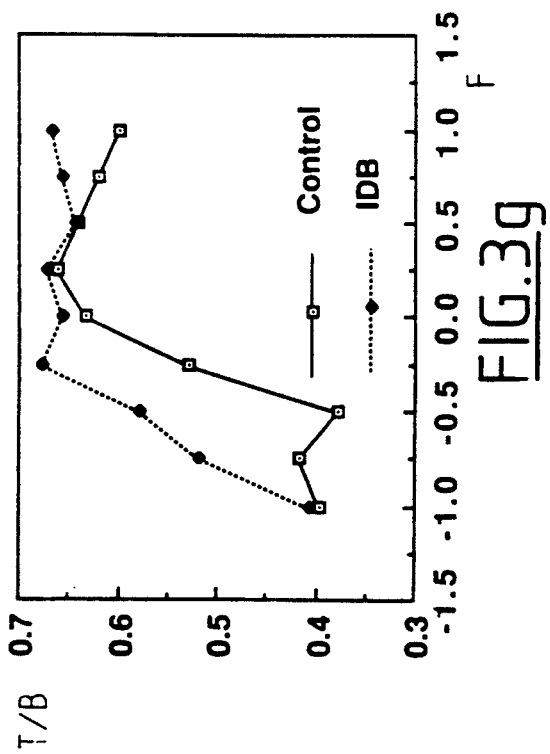

INTERRUPTED DEVELOPING PROCESS FOR A PHOTORESIST IMAGE

BACKGROUND OF THE INVENTION

Rapid advances have been made in improving the resolution and depth of focus of images formed using photolithographic processes in recent years. These developments have been particularly useful in forming images on wafer type substrates as are used in the fabrication of integrated circuits.

There are several major steps which are common to all integrated circuit imaging processes used to replicate integrated circuit pattern geometries on the wafer surfaces. First the substrate, preferably a wafer, is coated with a photoresist which is usually composed of a phenolic resin known as a Novolak, and a photoactive compound or PAC which makes the resist sensitive to a particular exposure energy such as light, e-beams and X-rays. A photoresist composition, the photoresist and a solvent which dissolves the other components, is dispensed onto the surface of the substrate and is formed into a uniform thin layer of resist across the surface of the substrate, preferably by spinning Thereafter the coated substrate is preferably heated for a short period of time at a low temperature to remove the solvent, a process generally called soft baking. This baking is frequently carried out at a temperature in the neighborhood of 90° C. Thereafter a suitable mask representing the image to be formed in the resist is arranged on or in connection with the coated substrate. The image on the mask is transmitted into the resist by exposure to a suitable source of energy such as light, X-rays or e-beams, depending on the resist used. For example, a chrome relief replica of the desired image can be used which is illuminated by exposing radiation and pattern transfer can be accomplished by contact between the mask and the substrate, proximity printing or projection printing.

The minimum width of the lines and spaces formed in the photoresist determine the resolution. This is influenced by, among other things, the wavelength of the exposing energy. The most commonly used lines of the mercury spectrum are the g-line (436 nm), h-line (405 nm) and i-line (365 nm). Generally, the use of shorter wavelengths results in better resolution and for a given resolution, in a greater depth of focus In some techniques, the formation of standing waves within the resist is prevented by using a supplemental bake following the exposure to energy and prior to development. This so-called post exposure bake (PEB) is usually carried out at temperatures between 100° and 120° C.

Common to all processes is that the exposed resist is developed in an alkaline solution called a developer which results in the removal of selected, predetermined, areas of the resist Depending on the system and mask employed, the image on the resist can be positive or negative.

The verticality of the developed resist profile impacts the minimum resolution available, that is, the minimum feature sizes which can be delineated. Any scattered light, for instance light scattered within the resist film, results in unwanted erosion from the resist profile during development since those partially exposed areas are slightly attacked by the developer solution. This results in a degradation of the minimum resolution which can be achieved.

A number of techniques have been developed in the prior art to reduce this effect The most successful reported to date are known as the HARD and LENOS processes. Endo et. al., "High Aspect-Ratio Resist Pattern Fabrication by Alkaline Surface Treatment", Digest of Papers 1st MicroProcess Conference, Tokyo, page 164 (1988); Ogawa et. al., "LENOS: Latitude Enhancement Novel Single Layer Lithography", Digest of Papers 1st MicroProcess Conference, Tokyo, page 162 (1988). Both of these processes involve soaking the spun resist film in developer solution prior to exposure, whereupon trace quantities of the base are permitted to become absorbed into the surface. The application of baking cycles follow this treatment and are believe to catalytically enhance a crosslinking reaction between the binder resin and the unexposed photoactive component. As a consequence, an increased degree of surface inhibition is observed at the very top of the developing resist profile, which serves to improve the final profile. However, a disadvantage of these techniques is that the rather extended baking temperatures and times are needed, while only the top of the profile is improved, which is not surprising as the presence of the diffused developer is confined very much to the uppermost layer of the resist.

Moreau et. al., "Contrast and Sensitivity Enhancement of Resists for High Resolution", J. Vac. Sci. Technol B, Vol. 6, 2238, Nov/Dec 1988 have reported a slight improvement in resist profiles when an interrupted development cycle was carried out. Under these conditions, the wafer is rinsed and spun dry midway through development, as opposed to simply continuing with the second development cycle as in a conventional double puddle process. It has also been reported that this technique has been used with multiple interrupted development cycles, with further improvement. However this technique is not universally employable as it is not effective with some resists, most notably those such as KTi 895i where the resin is bound to the photoactive compound There is therefore still a need for a process of general applicability where the time penalty is not as great. It is accordingly the object of this invention to provide such an improved process and to provide improved resist images resulting therefrom.

This and other objects of this invention will become apparent to those skilled in this art from the following detailed description in which:

FIG. 3a through 3g are graphs of focus versus top/base ratio (a measure of profile verticality) of profiles obtained using different combinations of resist and developers.

SUMMARY OF THE INVENTION

This invention relates to a method of improving a developed resist image and more particularly to a process of developing a photoresist by contacting it with a developer and improving the conventional process by subjecting the photoresist to heat prior to completion of the development process. Preferably heat is applied using hot water as this requires no spin drying of the wafer. The photoresist so treated is also part of this invention.

DESCRIPTION OF THE INVENTION

FIGS. 1A through 1D illustrate the steps common to essentially all imaging processes. A substrate 1 is coated with a suitable photoresist 2 and a mask 3 representing the image desired, either in positive or negative form, is arranged on photoresist 2. The coated substrate is then exposed to radiation energy R through mask 3 activating the photoresist in the exposed areas. Thereafter the mask is removed and the coated substrate is subjected to a developer.

Figure 1A:
FIG. 1A through 1G are schematic representations of the process of the present invention.
Figure 1B:
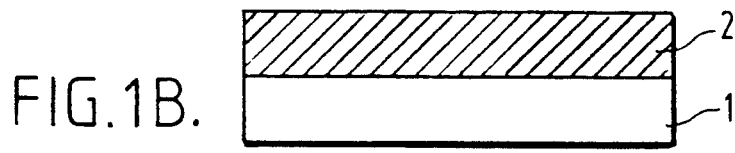
Figure 1:
Figure 1:
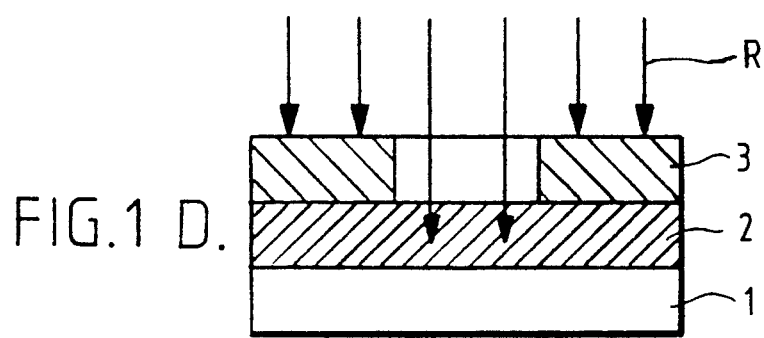
Figure 1:
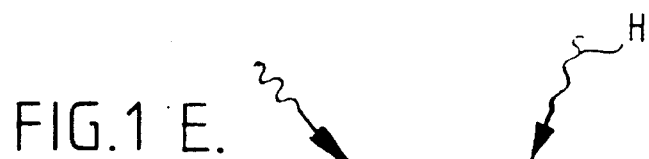
Figure 1F:
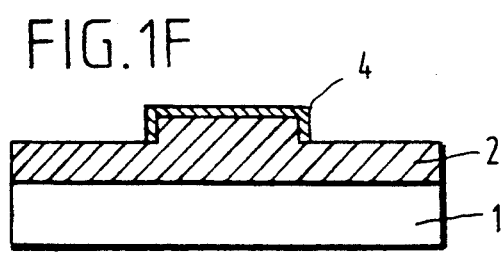
Figure 1:
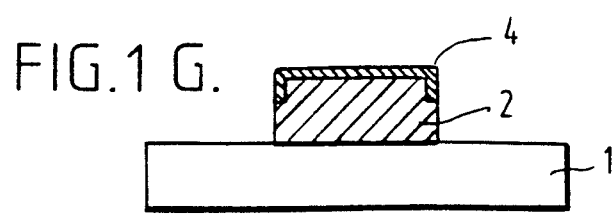

In accordance with the present invention, the development process is interrupted and a short, low temperature, bake is administered to the partially developed resist coated substrate. This is shown in FIG. 1E where the partially developed photoresist 2 is subjected to heat H. Without being limited to theory, it is believed that the application of heat probably enhances the crosslinking between the unexposed photoactive compound and the binder resin in the surface area 4 of the exposed photoresist, as shown in FIG. 1F. The resulting passivation is distributed over the exposed upper half of the resist profile and the passivated layer is more resistant to the subsequent continued exposure to the developer, resulting in greatly reduced erosion of the upper resist profile. The final developed resist having an improved resist profile is shown in FIG. 1G.

Exposure to the developer in the present invention is stopped one or more times at any convenient time before complete development in order to realize a partially developed photoresist. In general, it is convenient to stop the exposure to the developer from about $\frac{1}{4}$ to $\frac{5}{8}$ of the normal development time.

In the preferred embodiment of the invention, the duration of the first development step is preferably chosen so that approximately half of the developed profile has been exposed to the developer surface. Depending on the particular resist formulation employed, this approximates crudely to about one-half of the total development time When two developer step processes are used, the duration of each development step is preferably between about 10 and 40 seconds, most preferably from about 20 to 30 seconds.

The temperature used in the low temperature bake is generally below about 90° C. and most usually between about 30° to 60° C. The manner in which the heat is generated is not restricted and this can be accomplished by the use of, for example, an infrared lamp, warm air or other gas or, most preferably, by the use of warm water. Water has the advantage of not requiring any prior drying of the wafer surfaces This in turn means that multiple water treatments are a practical reality. Exposure times of preferably about 10 to about 60 seconds, more preferably between about 20 and 40 seconds, can be used although longer heating times can be employed if desired. The particular time/temperature tradeoff is dependent on the resist and developer combination being used.

The use of warm water to affect the baking is desirable and preferable for a variety of reasons. As noted above, there is no need to dry the wafer as in some other type of baking cycles and therefore the cycle time can be significantly reduced. Hardware modifications required to implement the invention on conventional in-track development systems is minimal and it is applicable to every type of development technique such as puddle, immersion and spray. Any concerns about the detrimental effect on yield raised by other baking cycles are clearly less of a concern using water and such use also reduces the possibility of particle generation, and gives rise to a potential of carrying out baking steps at more than one point during development thereby gaining an even greater degree of profile development.

At present, it is preferred to sandwich the heat treatment in between two much shorter cool water rinses. The rationale is to quench the first development step at the same temperature as that of the developer solution whereas if warm water was used, the diluted warm developer during the first few seconds could conceivably cause nonuniformity problems. The same rationale, insuring a measure of temperature equilibrium, is the reason for the second short water rinse prior to the resumed developer exposure. These washes can be quite short, on the order of 5 to 10 seconds. No qualitative differences in the developed resist profile have been observed when varying the initial cool water rinse between 7 seconds and 1 minute.

In order to further illustrate the present invention, various Examples are set forth below. Throughout this specification and claims, including the Examples, all parts and percentages are by weight and all temperatures in degrees Centigrade unless otherwise specified.

EXAMPLE 1

A wafer substrate was coated with a film of Shipley TM 3413 photoresist by spinning at 4600 rpm. Following soft baking at 95° C. for 65 seconds, a mask containing a 0.7 $\mu$m line/space pattern was arranged on the substrate. Exposures were carried out using a GCA 8000 i-line wafer stepper which had been fitted with a 0.35 NA, 5x Tropel reduction lens. The wavelength used was 365 nm and the exposure energy was approximately 195 mJ/cm$^2$ while exposures were varied between 1.3 seconds (182 mJ/cm$^2$) and 1.8 seconds (252 mJ/cm$^2$).

The resist was developed using a double puddle process in which Shipley TM MF 319 was used as the developer. A puddle was formed on the substrate and after 22 seconds, the substrate was rinsed, dried and subjected to 30 seconds of irradiation from a Philips 150 Watt Infraphil TM lamp (model PAR 38-E) which was held at a distance of 11 centimeters. Thereafter a second 22 second puddle was carried out after which the wafer was rinsed and spun dried.

As a control, the same process was repeated omitting the heating step and using an asymmetrical double puddle of 12 and 32 seconds, respectively, instead of the symmetrical double puddle. This control procedure is the method recommended by the manufacturer of the reagents.

Figure 2:
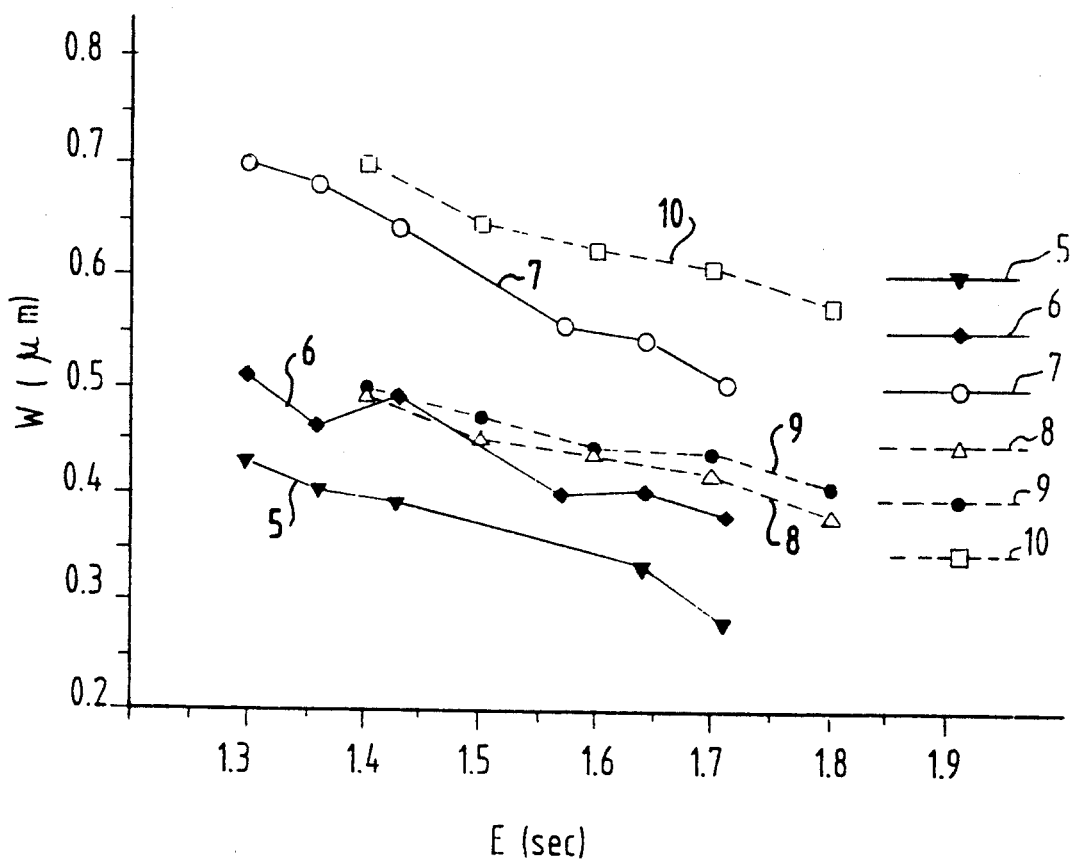
FIG. 2 is a graph showing cross-sectional measurement of different parts of a profile obtained using a standard process and with the process of the present invention.
Figure 3A:
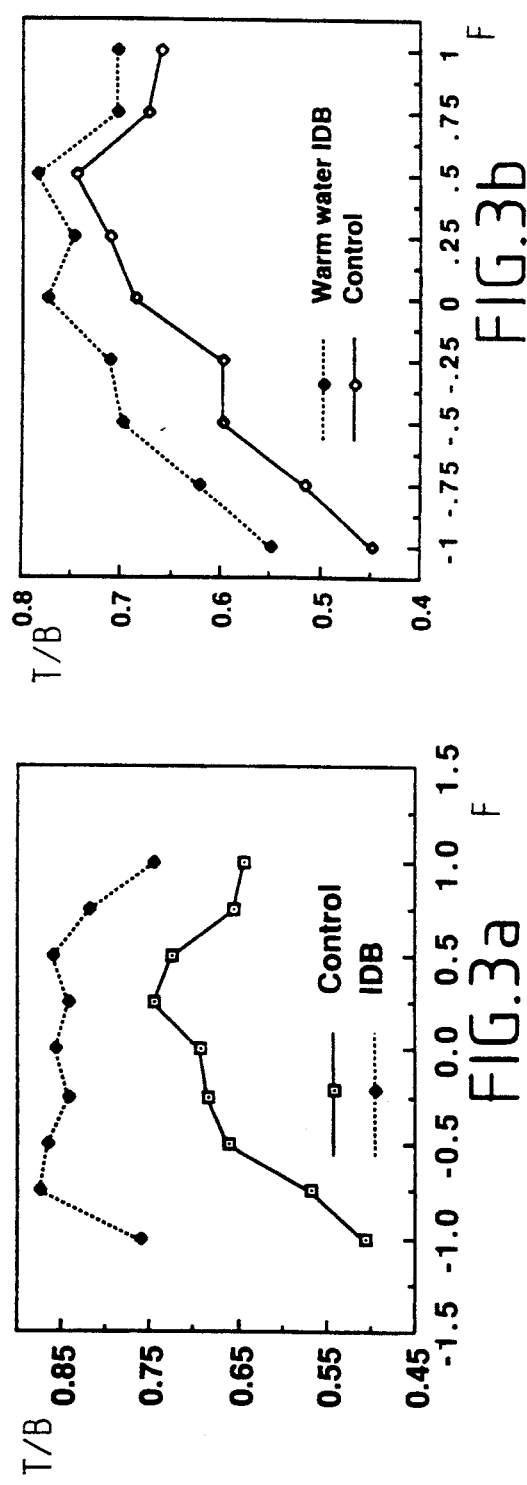
Figure 3B:
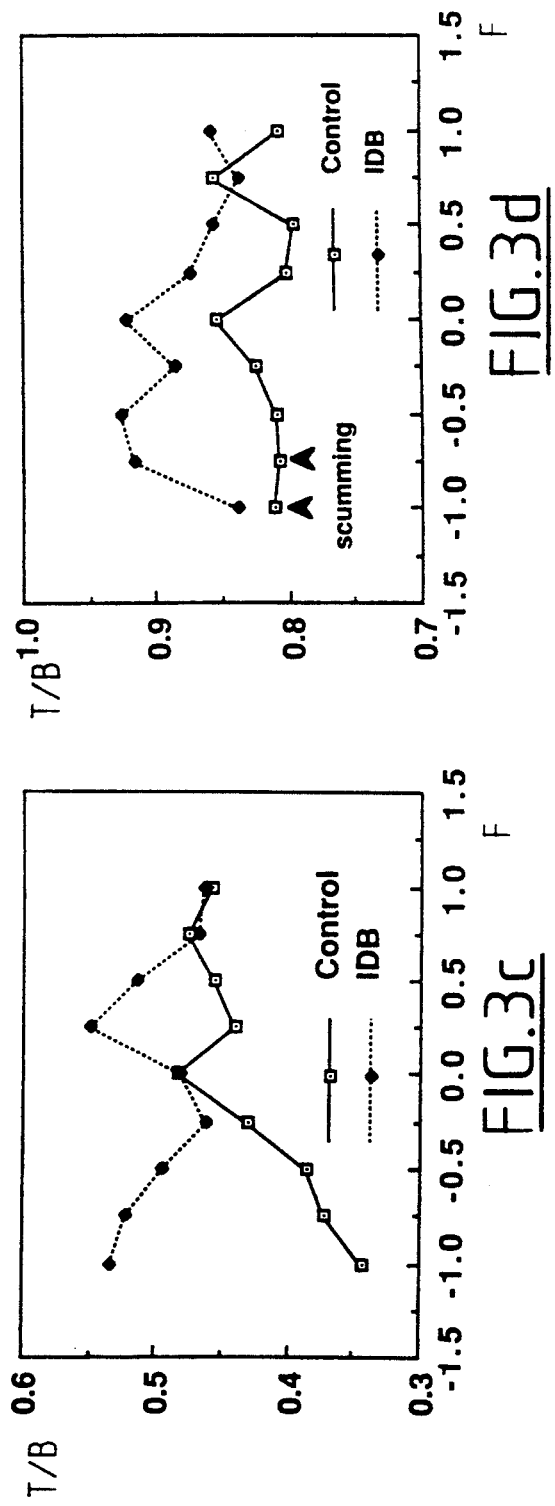
Figure 3C:
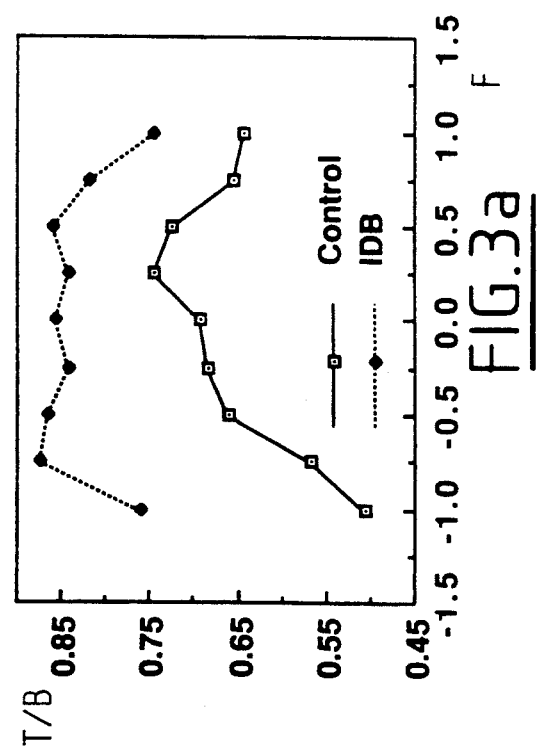
Figure 3D:
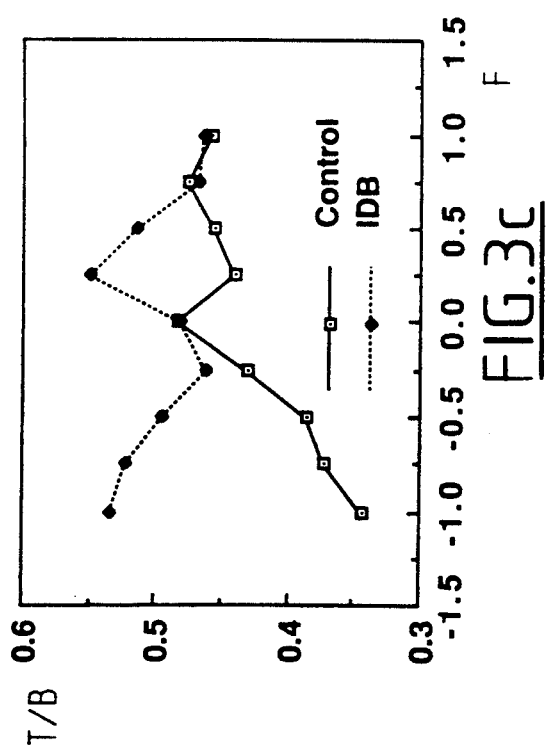

SEM cross-sectional measurements were made at the base, mid section and top of the resist and the results are set forth in FIG. 2. The axis of this figure show the results of this measurement W in microns plotted against the exposure time E in seconds. The solid lines labeled 5, 6 and 7 represent the control measurements at the top, mid section and base of the profile, respectively, and the dotted lines 8, 9 and 10 similarly refer to the top, mid section and base measurements of the profile in the resist of the present invention. It is clearly seen that the profiles obtained using the process of the present invention provide a much closer match between the top and mid sections and therefore a more vertical profile is provided.

In addition to the standard asymmetric 12/32 second double puddle process recommended by the manufacturer, a second control test was carried out using an interrupted development in which the wafer was rinsed and spun dry in-between two 20 second puddle development steps The resulting cross-sectional SEM showed that the interrupted development sample resulted in a degraded profile.

Similar tests were carried out with another positive resist, Fuji-Hunt 6100, with similar improvements in profile being noted.

EXAMPLE 2

Example 1 was repeated with Olin Hunt H.PR 6512 positive resist, except that the IR exposure of the wafer was conducted under a blanket of nitrogen. No differences were noted with the sample heated in air and therefore oxidation appears not to be a part of the inventive mechanism.

The Example 1 procedure was also repeated carrying out the IR heat treatment while the wafer was covered with a film of water and this was found to be as effective as carrying out the heating on a dry wafer. The procedure was then repeated exposing the wafer to the IR heat treatment continuously through the development cycle and rounded top shoulder profiles were observed suggesting that there were conflicting reaction mechanisms taking place, with the effect of warm developer possibly being detrimental.

EXAMPLE 3

Example 1 was repeated except that the rinsed and dried wafer was exposed to a stream of warm air for 30 seconds rather than to IR heating. The temperature was chosen so that the stream of air arriving at the wafer surface did not exceed 40° C. in one instance and about 50° C. in a second. In both cases, improved profiles were observed

EXAMPLE 4

Example 1 was repeated except that at the end of the first 22 second puddle, the wafer substrate was rinsed with room temperature water for 7 seconds followed by streaming warm water onto the wafer surface for a period of 30 seconds and then by a second room temperature water rinse for 7 seconds prior to the second puddle development. Tests carried out with water at about 40°, 50°, 60° and 80° C. resulted in improved resist profiles.

EXAMPLES 5-11

Example 4 was repeated using a warm (between 40° and 50° C.) water intermediate development bake with the following combinations of resists and developers.

| Example No. | Resist | Developer |
| --- | --- | --- |
| 5 | Shipley/Aspect 912 | 0.245 track |
| 6 | JSR 1X 150 i-line resist | 0.238 WA |
| 7 | JSR 7750 g-line resist | 0.238 WA |
| 8 | KTI 895i | KTi 945 |
| 9 | Olin HPR204 | Olin HPRD428 |
| 10 | Olin HiPR 6512 | HPRD428 |
| 11 | Olin HiPR 6512 | Hunt RX 460 |

The results of these experiments are shown in FIGS. 3a through 3g, respectively, in which the focus F is plotted against the top/base CD ratio T/B. In each figure, the open squares represent control measurements, that is where the conventional double puddle process was used, while solid circles represent the measurements of the "IDB" profile obtained in Examples 5 through 11, respectively.

EXAMPLE 12

Example 4 also was repeated using Microposit 351 and NMD-3 developers. The latter is a metal-free developer which does not contain resolution enhancing additives and/or surfactants. The former is a metal ion developer. In both instances, improved profiles were observed.

Various changes and modifications can be made in the process and products of the present invention without departing from the spirit and scope thereof. The various embodiments which have been disclosed herein were for the purpose of further illustrating the invention but were not intended to limit it.

What is claimed is:

1. In a process of developing an imaged photoactive compound-containing positive photoresist of novolak phenolic resin by contacting the photoresist with a liquid alkaline developer to obtain a relief image, the improvement which comprises interrupting the development prior to completion of the development process and subjecting the photoresist to heat and then completing the development process.

2. The process of claim 1 in which the heat applied is about 30° to 90° C.

3. The process of claim 2 in which the heat is applied for about 10 to 60 seconds.

4. The process of claim 3 in which the contacting of the photoresist with the developer is interrupted for said heat treatment when about ⅓ to ⅔ of the development time has elapsed.

5. The process of claim 4 in which the heat applied is about 35° to 60° C. and is applied for about 20 to 40 seconds.

6. The process of claim 5 in which the contact of the photoresist with the developer is interrupted for said heat treatment at about 50% of the development of the photoresist.

7. The process of claim 1 in which the contact of the photoresist with the developer is interrupted for said heat treatment a plurality of times.

8. The process of claim 1 in which the photoresist is heated by an infrared lamp.

9. The process of claim 1 in which the photoresist is heated by heated gas.

10. The process of claim 1 in which the photoresist is heated by heated water.

11. The process of claim 10 in which the photoresist is rinsed with water before heating.

12. The process of claim 10 in which the photoresist is rinsed with room temperature water before and after heating and during the interruption of the development.

13. The process of claim 1 in which the photoresist is rinsed with water before heating.

14. The process of claim 1 comprising the additional steps before commencement of development of arranging a photomast representing the pattern to be imaged on a photoresist coated substrate and exposing the photoresist coated substrate to radiation energy through said mask.

15. The process of claim 14 comprising the additional steps before commencement of development of coating a substrate with a photoresist composition and baking the photoresist composition coated substrate to remove any residual solvent therein before arranging the mask on the coated substrate.

16. The process of claim 1 in which the photoresist is contacted with the developer before and after the heating for about the same length of time.

17. The process of claim 16 in which each contacting with developer is carried out for about 10 to 40 seconds.

18. The process of claim 17 in which each contacting with developer is carried out for about 20 to 30 seconds.

* * * * *